US009530954B2

(12) United States Patent
Takagaki et al.

(10) Patent No.: US 9,530,954 B2
(45) Date of Patent: Dec. 27, 2016

(54) PIEZOELECTRIC ELEMENT

(71) Applicant: NGK INSULATORS, LTD., Nagoya (JP)

(72) Inventors: Tatsuro Takagaki, Nagoya (JP); Kazuyoshi Shibata, Nagoya (JP); Haruhiko Ito, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 367 days.

(21) Appl. No.: 14/078,887

(22) Filed: Nov. 13, 2013

(65) Prior Publication Data
US 2014/0139076 A1    May 22, 2014

(30) Foreign Application Priority Data
Nov. 19, 2012 (JP) .................. 2012-253699

(51) Int. Cl.
*H01L 41/047* (2006.01)
*H01L 41/053* (2006.01)
*H01L 41/083* (2006.01)
*H01L 41/23* (2013.01)
*H01L 41/273* (2013.01)

(52) U.S. Cl.
CPC ....... *H01L 41/0533* (2013.01); *H01L 41/0471* (2013.01); *H01L 41/083* (2013.01); *H01L 41/23* (2013.01); *H01L 41/273* (2013.01)

(58) Field of Classification Search
USPC .................................. 310/340, 366
See application file for complete search history.

(56) References Cited

U.S. PATENT DOCUMENTS

| 4,054,808 | A  | * | 10/1977 | Tanaka | ............... B06B 1/0681 310/323.21 |
| 2001/0009344 | A1 | * | 7/2001 | Furukawa | ........... H01L 41/0533 310/358 |
| 2002/0153431 | A1 |   | 10/2002 | Sato et al. | |
| 2003/0168941 | A1 |   | 9/2003 | Maichl et al. | |
| 2006/0132001 | A1 |   | 6/2006 | Sugg | |

(Continued)

FOREIGN PATENT DOCUMENTS

| DE | 102 17 361 A1 | 12/2002 |
| DE | 102 60 853 A1 | 7/2004 |

(Continued)

OTHER PUBLICATIONS

European Search Report (With English Translation) dated Nov. 6, 2014 (5 pages).

*Primary Examiner* — Thomas Dougherty
(74) *Attorney, Agent, or Firm* — Burr & Brown, PLLC

(57) ABSTRACT

A piezoelectric element is a laminated type piezoelectric element including a plurality of piezoelectric layers laminated on each other; and an internal electrode layer disposed between adjacent piezoelectric layers. In the piezoelectric element, coating layers are disposed on a side surface of the piezoelectric element so as to cover at least an effective portion of the internal electrode layer that is exposed at the side surface. The coating layers contiguously extend from the side surface of the piezoelectric element to at least one of upper and lower surfaces of the piezoelectric element. A step is formed at the at least one of upper and lower surface of the piezoelectric element by the coating layers formed at an edge region.

16 Claims, 13 Drawing Sheets

(56) References Cited

U.S. PATENT DOCUMENTS

| | | | |
|---|---|---|---|
| 2008/0238261 A1* | 10/2008 | Ohashi | H01L 41/0533 310/340 |
| 2009/0000092 A1 | 1/2009 | Sugg | |
| 2010/0025065 A1 | 2/2010 | Goat et al. | |
| 2011/0001399 A1* | 1/2011 | Oguni | H01C 1/14 310/366 |
| 2013/0107422 A1* | 5/2013 | Lee | H01C 7/10 361/321.2 |
| 2013/0342082 A1* | 12/2013 | Itoh | H01L 41/0838 310/366 |
| 2014/0177128 A1* | 6/2014 | Kim | H01G 4/12 361/301.4 |

FOREIGN PATENT DOCUMENTS

| | | |
|---|---|---|
| JP | H03-241802 A | 10/1991 |
| JP | 2001-135872 A1 | 5/2001 |
| JP | 2002-319715 A | 10/2002 |
| JP | 2006-049717 A | 2/2006 |
| JP | 2006-505144 A | 2/2006 |
| JP | 2012-134336 A | 7/2012 |
| WO | 01/89003 A1 | 11/2001 |

* cited by examiner

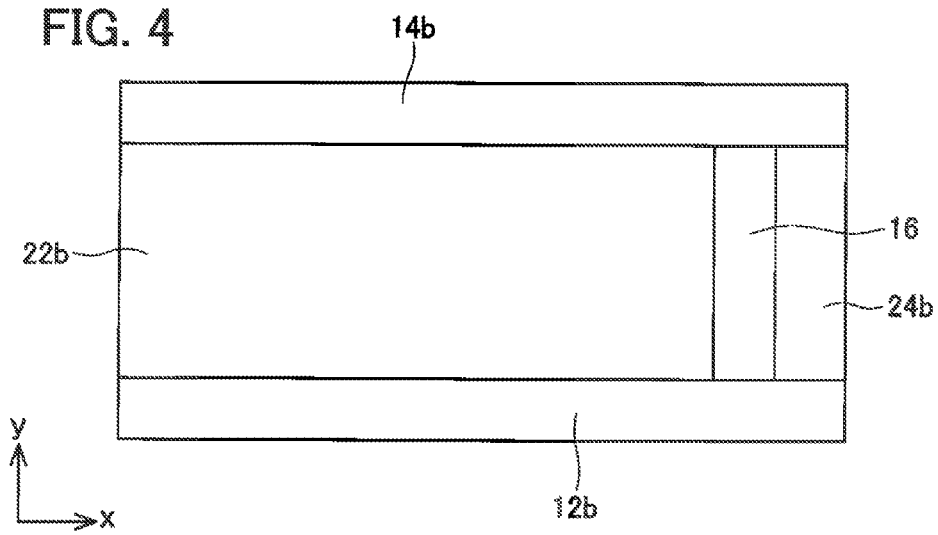
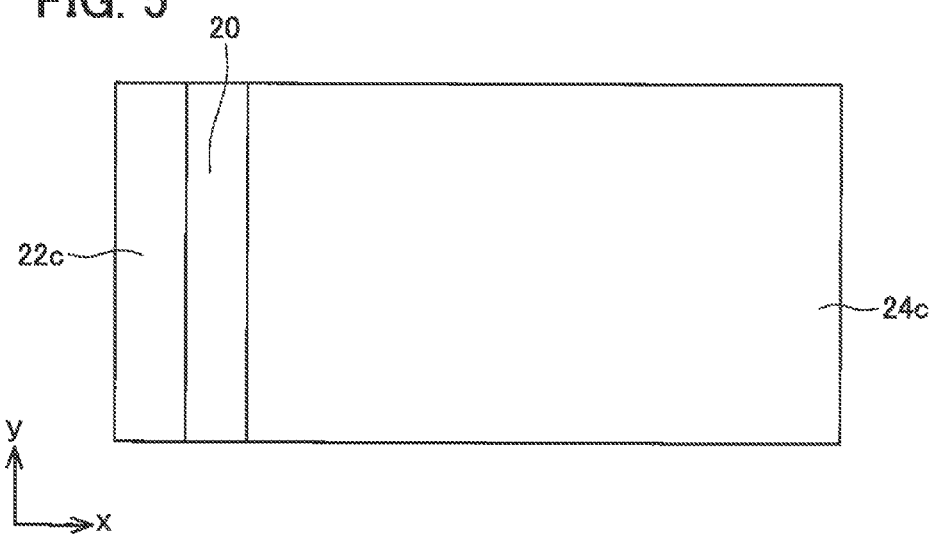

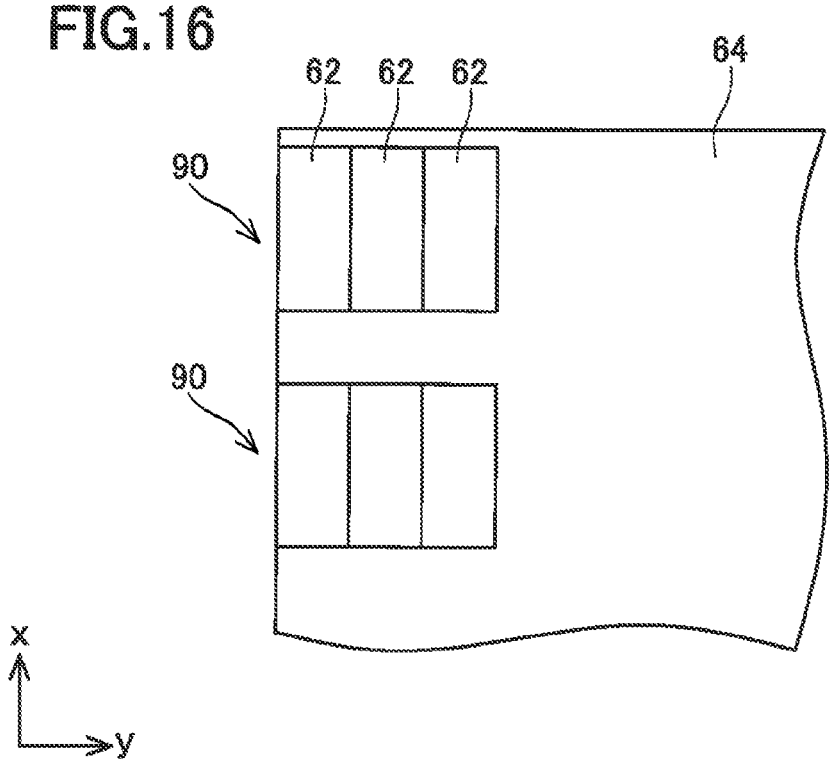
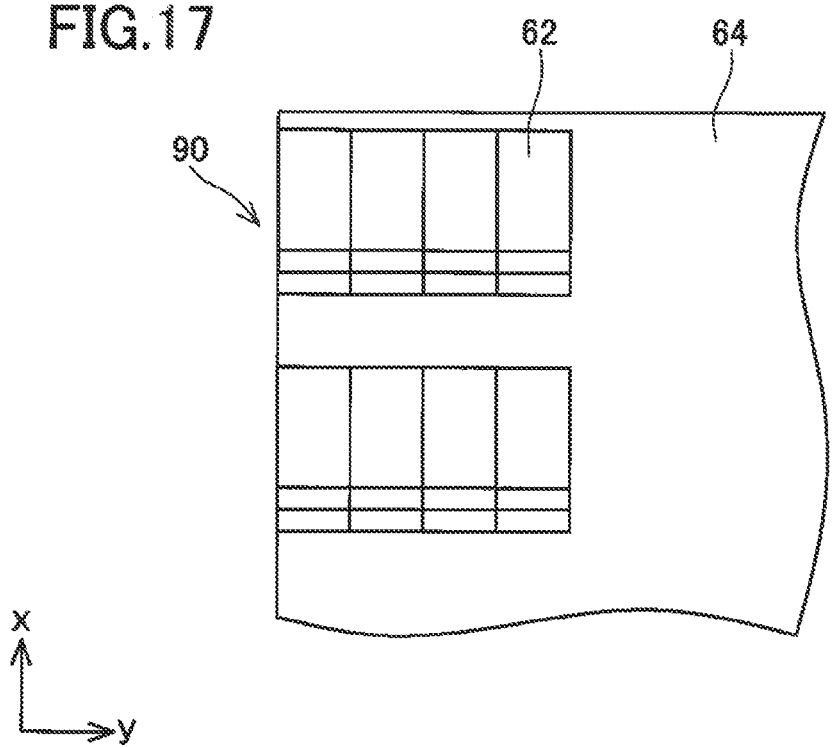

PIEZOELECTRIC ELEMENT

CROSS-REFERENCE TO RELATED APPLICATION

This application claims priority to Japanese Patent Application No. 2012-253699 filed on Nov. 19, 2012, the contents of which are hereby incorporated by reference into the present application.

BACKGROUND OF THE INVENTION

Field of the Invention

The present teachings relate to a laminated piezoelectric element.

Description of Related Art

In a laminated piezoelectric element, piezoelectric layers and internal electrode layers are alternatingly laminated together, and voltage is applied across the piezoelectric layers. With a piezoelectric element of this type, the internal electrode layers are exposed at the side surfaces of the piezoelectric element, so that a so-called migration phenomenon can easily occur in which the metals included in the internal electrode layers are ionized and these ions shift between the electrodes. Thus, in order to prevent this migration phenomenon, a piezoelectric element has been developed in which ceramic coating layers are provided upon surfaces (e.g., refer to Japanese Patent Application Publication No. 2001-135872). By forming such ceramic coating layers upon the surfaces of the piezoelectric element, moisture resistance is improved and the phenomenon of migration is prevented. Moreover, deterioration of characteristics of the piezoelectric element due to fouling is suppressed by the formation of such ceramic coating layers.

SUMMARY OF THE INVENTION

With a piezoelectric element described in the above publication, a ceramic coating layer is formed over an entire surface of the piezoelectric element (in other words, over its upper surface, its lower surface, and both its side surfaces). Due to this, in order to connect surface electrodes of the piezoelectric element to external wiring, it is necessary to form openings by removing portions of the ceramic coating layer, and to employ these openings. Thus, during manufacture of the piezoelectric element described in the above publication, it is necessary to provide a process for forming the openings in the ceramic coating layer.

The object of the present teachings is to provide a piezoelectric element that can be simply and easily connected to external wiring, while still ensuring good moisture resistance so as to prevent deterioration of its characteristics.

A piezoelectric element disclosed herein comprises a plurality of piezoelectric layers laminated on each other; and an internal electrode layer disposed between adjacent piezoelectric layers. A coating layer is disposed on a side surface of the piezoelectric element and at least one of upper and lower surfaces of the piezoelectric element. The coating layer contiguously extends from the side surface of the piezoelectric element to the at least one of the upper and lower surfaces of the piezoelectric element. The coating layer covers an effective portion of the internal electrode layer, the effective portion being exposed at the side surface of the piezoelectric element. The coating layer covers a predetermined peripheral part of the at least one of the upper and lower surfaces of the piezoelectric element. Further, the at least one of the upper surface and lower surfaces of the piezoelectric element has a step formed at an edge of the predetermined peripheral part by the coating layer.

Here, the "effective portion of the internal electrode layer" means the portion of the internal electrode layer that opposes another electrode layer that is adjacent to that internal electrode layer, when the piezoelectric element is seen in a planar view. In other words, when a voltage is applied between the internal electrode layer and the another electrode layer that is adjacent to the internal electrode layer, the portion of that internal electrode layer that applies an electric field to the piezoelectric layer that is disposed between that internal electrode layer and the another electrode layer in order to deform that piezoelectric layer is the "effective portion of the internal electrode layer".

With this piezoelectric element, the effective portion of the internal electrode layer that is exposed to the side surface of the piezoelectric element is covered by the coating layer. Due to this, it is possible to prevent ingress of moisture to the internal electrode layer, and it is thus possible to enhance reliability of the piezoelectric element. Moreover, since the coating layer covers the effective portion of the internal electrode layer, accordingly it is possible to suppress fouling of the piezoelectric element, and therefore it is possible to prevent deterioration of the characteristics of the piezoelectric element caused by the fouling. Furthermore, the coating layer is formed contiguously over the region of at least one of the end portions of the upper surface and the lower surface of the piezoelectric element. In other words, the coating layer is formed upon a portion of the upper surface or the lower surface of the piezoelectric element, but is not formed over its entirety. Due to this, it is possible to perform connection of the wiring to the surface electrodes of the piezoelectric element in a simple and easy manner. Accordingly with this piezoelectric element, by ensuring good moisture resistance, it is possible to perform the connection of the wiring simply and easily, while still preventing deterioration of the characteristics of the piezoelectric element.

BRIEF DESCRIPTION OF DRAWINGS

FIG. 4 is a planar view of the piezoelectric element 10;

FIG. 5 is a bottom view of the piezoelectric element 10;

FIG. 16 is a first figure for explanation of a method of manufacture according to another variant embodiment;

FIG. 17 is a second figure for explanation of a method of manufacture according to this other variant embodiment;

DETAILED DESCRIPTION OF THE INVENTION

Figure 1:
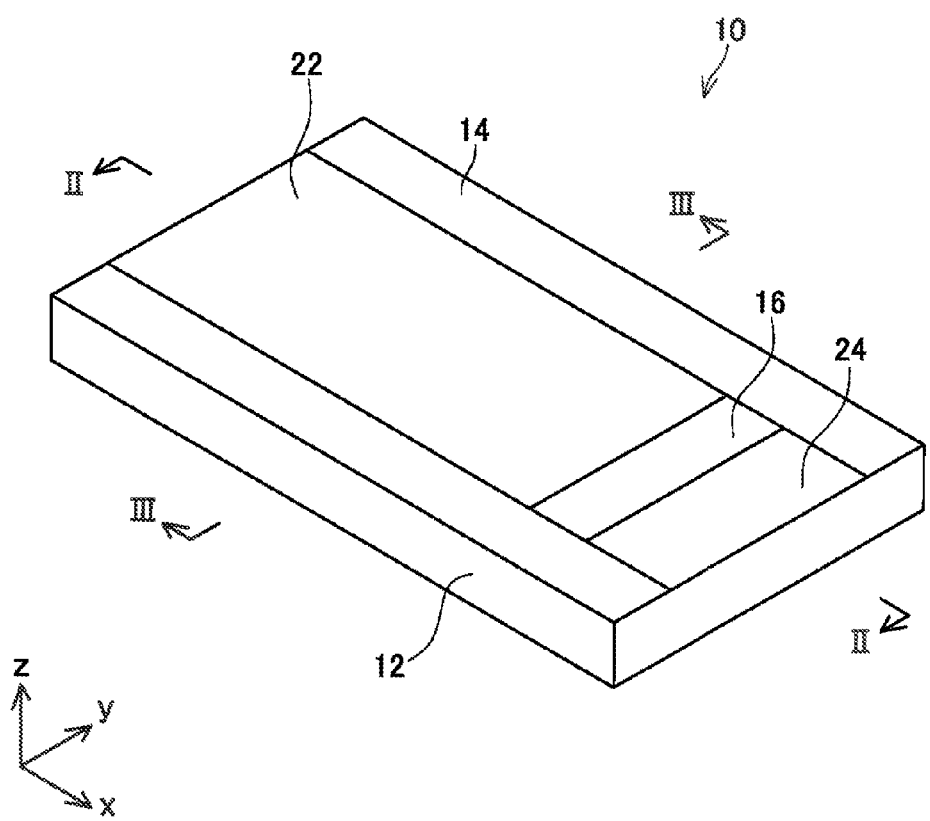
FIG. 1 is a perspective view of a piezoelectric element 10 according to an embodiment of the present teachings.

In the piezoelectric element disclosed herein, the coating layer may be disposed on both of the upper and lower surfaces of the piezoelectric element, and a shape of a first part of the coating layer may be different from a shape of a second part of the coating layer, the first part being disposed on the upper surface of the piezoelectric element, and the second part being disposed on the lower surface of the piezoelectric element.

According to this type of structure, since the coating layer is formed contiguously upon the upper surface of the piezoelectric element and/or upon its lower surface, accordingly it is possible even further to prevent ingress of moisture to an end surface of the internal electrode that is exposed to the side surface of the piezoelectric element. Moreover, even if the coating layer is formed upon both the upper surface and the lower surface of the piezoelectric element, it is still possible to distinguish the upper surface and the lower surface of the piezoelectric element by inspection of the coating layer, since the shape of the coating layer that is formed upon the upper surface of the piezoelectric element and the shape of the coating layer that is formed upon the lower surface of the piezoelectric element are different.

The piezoelectric element disclosed herein may further comprise an upper surface electrode disposed on an upper surface of the plurality of laminated piezoelectric layers, and a lower surface electrode disposed on a lower surface of the plurality of laminated piezoelectric layers. The coating layer may be disposed on a lower surface of the lower surface electrode, and the step may be formed at a boundary between the coating layer and the lower surface electrode.

According to this type of structure, the coating layer is formed upon the lower surface of the piezoelectric element, and this coating layer is formed over the lower surface electrode. Due to this, when the piezoelectric element is put into use (for example, when the piezoelectric element is mounted in a fitting location), it is possible to prevent direct contact of the lower surface electrode against a mounting surface, so that it is possible to prevent fouling of the lower surface electrode.

The piezoelectric element disclosed herein may have a rectangular shape having long sides and short sides in a planar view. Deformation of the piezoelectric element in a direction parallel to the long sides may be used as an actuator, and the coating layer disposed on the at least one of the upper and lower surfaces of the piezoelectric element may be disposed along the long sides of the piezoelectric element.

According to this type of structure, it is possible to prevent hampering of deformation of the piezoelectric element by the coating layer (in detail, it is possible to prevent the hampering of the deformation of the piezoelectric element in the direction in which it is employed as the actuator).

In the piezoelectric element disclosed herein, the coating layer may be disposed on both side surfaces of the piezoelectric element. The coating layer may be disposed on the at least one of the upper and lower surfaces of the piezoelectric element and extends along the long sides of the piezoelectric element. In the at least one of the upper and lower surfaces of the piezoelectric element, a sum of a first width of the coating layer extending along one of the lung sides of the piezoelectric element and a second width of the coating layer extending along the other of the long sides of the piezoelectric element may be shorter than half of a short side length of the piezoelectric element. The first and second widths may be widths in a direction parallel to the short sides of the piezoelectric element.

According to this type of structure, the width of the coating layer formed upon the upper surface of the piezoelectric element (i.e. the width in the direction of the short side of the piezoelectric element) and/or the width of the coating layer formed upon the lower surface of the piezoelectric element is limited. Due to this, along with it being possible appropriately to suppress the hampering of the deformation of the piezoelectric element (in more detail, the deformation thereof in the direction in which it is used as the actuator (i.e. in the direction of its long sides)), and along with effectively preventing occurrence of chipping or cracking at corners of the piezoelectric element, also it becomes possible effectively to increase a thickness of the piezoelectric element, so that it is possible to enhance bending strength of the piezoelectric element.

The piezoelectric element disclosed herein may have a rectangular shape having a pair of first sides extending in a first direction and a pair of second sides extending in a second direction perpendicular to the first direction in a planar view. The coating layer may be disposed on the at least one of the upper and lower surfaces of the piezoelectric element and extend along the pair of the first sides. The piezoelectric element may further comprise a first surface electrode disposed on the at least one of the upper and lower surfaces of the piezoelectric element, the first surface electrode extending along one of the pair of the second sides of the piezoelectric element; a second upper surface electrode disposed on the at least one of the upper and lower surfaces of the piezoelectric element, the second upper surface electrode being disposed away from the first upper surface electrode and extending along the other of the pair of the second sides of the piezoelectric element; and a second coating layer covering at least one of a second surface electrode-side edge of the first surface electrode and a first surface electrode-side edge of the second surface electrode.

According to this type of structure, it is possible to enhance reliability of the piezoelectric element, since a boundary between the first surface electrode and the piezoelectric layer, and/or a boundary between the second surface electrode and the piezoelectric layer, is protected by the coating layer.

First Embodiment

Figure 2:
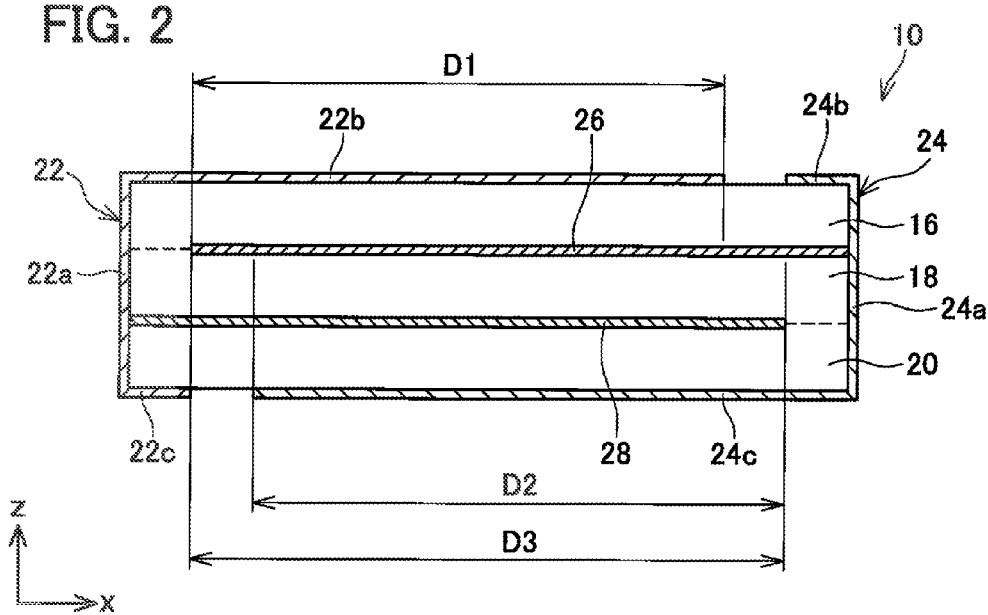
FIG. 2 is a sectional view of FIG. 1 taken along a line II-II.
Figure 3:
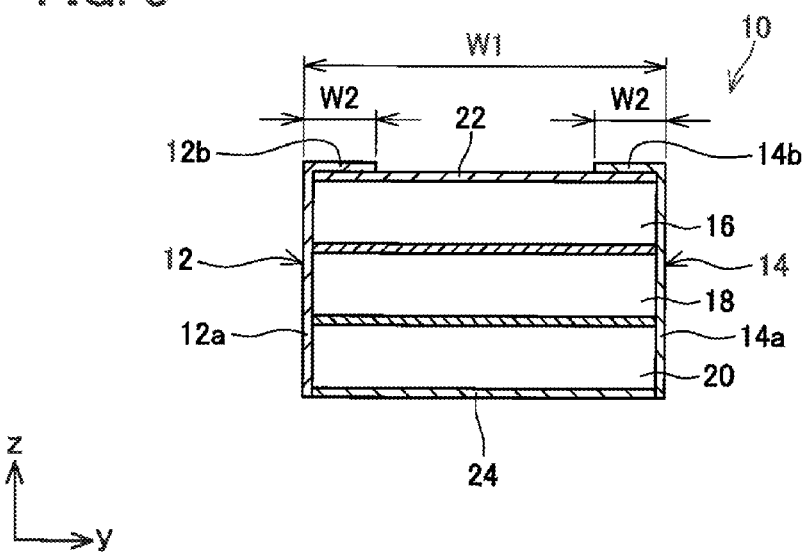
FIG. 3 is a sectional view of FIG. 1 taken along a line III-III.

As shown in FIGS. 1 through 3, a piezoelectric element 10 according to this embodiment comprises piezoelectric layers 16, 18, and 20, internal electrode layers 26 and 28, surface electrodes 22 and 24, and insulating coating layers 12 and 14. The piezoelectric element 10 is a laminated piezoelectric element in which piezoelectric layers 16, 18, and 20 and internal electrode layers 26 and 28 are alternatingly laminated together. Surface electrodes 22 and 24 and insulating coating layers 12 and 14 are formed upon the surfaces of the laminated mass that comprises the piezoelectric layers 16, 18, and 20 and the internal electrode layers 26 and 28 laminated together.

The piezoelectric layers 16, 18, and 20 are made from a publicly known piezoelectric material. For example, a PZT series ceramic (Pb(Zr,Ti)O3), a titanium oxide barium series ceramic, a titanium oxide lead series ceramic or the like may be used as the piezoelectric material. As seen in planar view, each of the piezoelectric layers 16, 18, and 20 is formed as a plate-shaped rectangle. In concrete terms, each of the piezoelectric layers is formed in a rectangular shape, whose long sides in the figure will be referred to as the X direction while its short sides will be referred to as the Y direction. All of the piezoelectric layers 16, 18, and 20 have the same shape.

The internal electrode layers 26 and 28 are made from a publicly known electrode material. For example, platinum, silver, an Ag—Pd alloy, gold, nickel, copper or the like may be used as the electrode material. If the electrode layers are to be fired at the same time as the piezoelectric material layers, then it is desirable to employ a material whose main component is platinum. A publicly known method may also be used as the method for forming the internal electrode layers 26 and 28; for example, a method of screen printing and firing an electrically conductive paste, a sputtering method, or a vacuum vapor deposition method may be used.

As shown in FIGS. 2 and 3, the internal electrode layer 26 is disposed between the adjacent piezoelectric layers 16 and 18. In other words, the internal electrode layer 26 is formed upon the lower surface of the piezoelectric layer 16 (i.e. upon the upper surface of the piezoelectric layer 18). As shown in FIG. 2, on the lower surface of the piezoelectric layer 16, the internal electrode layer 26 is not formed upon a region along its short side that is positioned towards the negative (−) X direction. Due to this, the internal electrode layer 26 is exposed to the side surfaces (in the Y-Z plane) of the piezoelectric layers 16 and 18 that are positioned towards the positive (+) X direction, but is not exposed the side surfaces of the piezoelectric layers 16 and 18 that are positioned towards the negative (−) X direction. On the other hand, as shown in FIG. 3, the internal electrode layer 26 is exposed to both the two side surfaces (in the X-Z plane) of the piezoelectric layers 16 and 18 that are positioned in both the Y direction, both positive (+) and negative (−). Moreover, the piezoelectric layer 16 and the piezoelectric layer 18 are in mutual contact in a region where the internal electrode layer 26 is not formed.

The internal electrode layer 28 is formed in a similar but opposite manner to the internal electrode layer 26. In other words, the internal electrode layer 28 is disposed between the adjacent piezoelectric layers 18 and 20. However, the difference from the internal electrode layer 26 is that, on the lower surface of the piezoelectric layer 18 (i.e. upon the upper surface of the piezoelectric layer 20), the internal electrode layer 28 is not formed upon a region along its short side that is positioned towards the positive (+) X direction. Due to this, the internal electrode layer 28 is exposed to the side surfaces (in the Y-Z plane) of the piezoelectric layers 18 and 20 that are positioned towards the negative (−) X direction, but is not exposed to the side surfaces of the piezoelectric layers 18 and 20 that are positioned towards the positive (+) X direction. And, just as with the internal electrode layer 26, the internal electrode layer 28 is exposed to both the two side surfaces (in the X-Z plane) of the piezoelectric layers 18 and 20 that are positioned in both the Y directions, both positive (+) and negative (−). Moreover, the piezoelectric layer 18 and the piezoelectric layer 20 are in mutual contact in a region where the internal electrode layer 28 is not formed.

Just like the internal electrode layers 26 and 28, the surface electrodes 22 and 24 may be made using a publicly known electrode material (for example, platinum). The method for forming the surface electrodes 22 and 24 will be explained hereinafter.

The surface electrode 22 is formed to extend over the entire side surfaces of the piezoelectric layers 16, 18, and 20 that are positioned in the negative (−) X direction (i.e. over one side of the piezoelectric element 10 in the Y-Z plane as a whole) (this portion is denoted by the reference symbol 22a). Moreover, this surface electrode 22 extends contiguously so as also to be formed upon the upper surface of the piezoelectric layer 16 (i.e. upon the upper surface of the piezoelectric element 10), and upon the lower surface of the piezoelectric layer 20 (i.e. upon the lower surface of the piezoelectric element 10). In concrete terms, the surface electrode 22 is formed over the entire region of the upper surface of the piezoelectric layer 16, except for a region along its short side in the positive (+) X direction (i.e. over the region shown by the reference symbol 22b). Furthermore, upon the lower surface of the piezoelectric layer 20, this surface electrode 22 is also formed over only a region along its short side in the negative (−) X direction (i.e. only over the region shown by the reference symbol 22c). And, as described above, the internal electrode layer 28 is exposed to the side surfaces (in the Y-Z plane) of the piezoelectric layers 16, 18, and 20 that are positioned in the negative (−) X direction, and the surface electrode 22 is formed upon this exposed portion. Due to this, the surface electrode 22 and the internal electrode layer 28 are electrically connected together, so that the same voltage is applied to each of them.

Moreover, the surface electrode 24 is formed to extend over the entire side surfaces of the piezoelectric layers 16, 18, and 20 that are positioned in the positive (+) X direction (i.e. over the other side of the piezoelectric element 10 in the Y-Z plane as a whole) (this portion is denoted by the reference symbol 24a). Furthermore, the difference from the surface electrode 22 is that, upon the upper surface of the piezoelectric layer 16, this surface electrode 24 is formed in a region along the short side in the positive (+) X direction (i.e. over the region shown by the reference symbol 24b). Yet further, the surface electrode 24 is formed over the entire lower surface of the piezoelectric layer 20, except for a region along its short side in the negative (−) X direction (i.e. over the region shown by the reference symbol 24c). As shown in FIGS. 1 and 3, gaps are defined between the surface electrode 22 and the surface electrode 24 upon the upper surface of the piezoelectric layer 16 and upon the lower surface of the piezoelectric layer 20, so that open stripes between these electrodes are left along the piezoelectric layers 16 and 20. Due to this, short circuiting between the surface electrodes 22 and 24 is prevented. As described above, the internal electrode layer 26 is exposed to the side surfaces (in the Y-Z plane) of the piezoelectric layers 16, 18, and 20 that are positioned in the positive (+) X direction, and the surface electrode 24 is formed upon this exposed portion. Due to this, the surface electrode 24 and the internal electrode layer 26 are electrically connected together, and the same voltage is applied to each of them.

As will be clear from the above explanation, each of the piezoelectric layers 16, 18, and 20 is sandwiched between one pair of the surface electrodes 22 and 24 and the internal electrode layers 26 and 28. In detail, the piezoelectric layer 16 is sandwiched between the portion 22b of the surface electrode 22 and the internal electrode layer 26, the piezoelectric layer 18 is sandwiched between the internal electrode layer 26 and the internal electrode layer 28, and the piezoelectric layer 20 is sandwiched between the internal electrode layer 28 and the portion 24c of the surface electrode 24. Due to this, by applying a voltage between the surface electrode 22 and the surface electrode 24, this voltage is applied between the upper surface and the lower surface of each of the piezoelectric layers 16, 18, and 20. Accordingly, an electric field in the Z direction is generated in the interior of each of the piezoelectric layers 16, 18, and 20, so that each of the piezoelectric layers 16, 18, and 20 is deformed. Incidentally, while in this embodiment this piezoelectric element 10 is explained as being an actuator that employs deformation of the piezoelectric layers 16, 18, and 20 in the X direction, this is not to be considered as being limitative of the present teachings; by an appropriate structure being provided, it could also employ deformation in the Z direction.

As shown in FIG. 2, the surface electrodes 22 and 24 and the internal electrode layers 26 and 28 are formed upon parts of the upper surfaces of the piezoelectric layers 16, 18, and 20 and upon parts of their lower surfaces. Due to this, when a voltage is applied between the surface electrodes 22 and 24, only certain portions of the piezoelectric layers 16, 18, and 20 substantially contribute to their deformation. In concrete terms: for the piezoelectric layer 16, deformation of the portion shown by the width D1 provides the most substantial contribution to the deformation of this piezoelectric layer 16; for the piezoelectric layer 18, deformation of the portion shown by the width D3 provides the most substantial contribution to the deformation of this piezoelectric layer 18; and, for the piezoelectric layer 20, deformation of the portion shown by the width D2 provides the most substantial contribution to the deformation of this piezoelectric layer 20. In other words, when the piezoelectric layers 16, 18, and 20 (i.e. the piezoelectric element 10) are seen in planar view, the electric fields for the deformation of these piezoelectric layers 16, 18, and 20 are generated in the ranges (ranges of mutual confrontation) where the electrodes that sandwich these piezoelectric layers (22b and 26, 26 and 28, and 28 and 24c) confront one another, and these portions provide the most substantial contributions to the deformation of these piezoelectric layers 16, 18, and 20. Accordingly, the range upon the internal electrode layer 26 shown by the width D1 becomes its effective portion for the piezoelectric layer 16, while its range shown by the width D3 becomes its effective portion for the piezoelectric layer 18. Moreover, the range upon the internal electrode layer 28 shown by the width D3 becomes its effective portion for the piezoelectric layer 18, while its range shown by the width D2 becomes its effective portion for the piezoelectric layer 20.

Insulating coating layers 12 and 14 are made from a publicly known insulating material. Any material that is capable of imparting moisture resistance to the piezoelectric element 10 may be employed as this insulating material, for example a PZT series ceramic (Pb(Zr, Ti)O3), a titanium oxide barium series ceramic, a titanium oxide lead series ceramic, or the like. By using the same material for the insulating coating layers 12 and 14 as the material for the piezoelectric layers 16, 18, and 20, it is possible to make the mechanical characteristics of the insulating coating layers 12 and 14 and the piezoelectric layers 16, 18, and 20 agree with one another, so that it is possible effectively to suppress the occurrence of problems when the piezoelectric layers 16, 18, and 20 and the insulating coating layers 12 and 14 are fired simultaneously.

As shown in FIGS. 1 and 3, the insulating coating layer 12 is formed over the entire side surfaces of the piezoelectric layers 16, 18, and 20 that are positioned in the negative (−) Y direction (an X-Z plane of the piezoelectric element 10 as a whole) (i.e. over the portion shown by the reference symbol 12a). Since the end surfaces of the internal electrode layers 26 and 28 are exposed at these side surfaces of the piezoelectric layers 16, 18, and 20 (in the X-Z plane), accordingly these end surfaces of the internal electrode layers 26 and 28 are covered by the insulating coating layer 12. Moreover, the insulating coating layer 12 is also formed continuously around onto a portion of the upper surface of the piezoelectric layer 16 (i.e. over the upper surface of the piezoelectric element 10). In concrete terms, upon the upper surface of the piezoelectric layer 16, the insulating coating layer 12 is formed in a region along the long side in the negative (−) Y direction (i.e. over the portion shown by the reference symbol 12b). Incidentally, it would also be acceptable for this insulating coating layer 12 also to be provided upon the end portion of the lower surface of the piezoelectric layer 20 (i.e. upon the lower surface of the piezoelectric element 10).

It should be understood that the surface electrodes 22 and 24 are partially formed upon the upper surface of the piezoelectric layer 16, and, at the portions where the surface electrodes 22 and 24 are formed, the insulating coating layer 12 is formed over the surface electrodes 22 and 24. Furthermore, at the portions where the surface electrodes 22 and 24 are not formed, the insulating coating layer 12 is formed over the piezoelectric layer 16. Due to this, a difference in level (i.e. a step) is defined between the surface electrodes 22 and 24 and the piezoelectric layer 16, and the insulating coating layer 12 (refer to FIG. 3). Moreover, it is desirable for the height of this step to be 50 μm or less, and to be greater than 0 μm. This is because, if the height of the step is greater than 50 μm, then the insulating coating layers 12 and 14 become too thick, and the possibility arises of it hampering the deformation (i.e. the displacement) of the piezoelectric element 10. By forming the insulating coating layers 12 and 14 only partially upon the surface end portions (i.e. upon the surface end portions of the piezoelectric element 10), as compared to the case of forming them upon the entire surfaces, along with it being possible to alleviate malfunctioning due to reduction of the displacement of the piezoelectric element 10, also it is possible to enhance the mechanical strength of the piezoelectric element 10 by the amount of the thickness of the insulating coating layers 12 and 14 formed upon the surface end portions. Moreover, it is also desirable for the thickness of the insulating coating layers 12 and 14 to be 5 μm or less, and to be greater than 0 μm. The main objective of these layers is to prevent the ingress of moisture, and to prevent contamination by unnecessary matter that has adhered to the piezoelectric element.

On the other hand, the insulating coating layer 14 is formed over the entire side surfaces of the piezoelectric layers 16, 18, and 20 that are positioned in the positive (+) Y direction (the other plane of the piezoelectric element 10 as a whole) (i.e. over the portion shown by the reference symbol 14a). Due to this, the internal electrode layers 26 and 28 that are exposed at this side surface of the piezoelectric layers 16, 18, and 20 (in the X-Z plane) are covered by the insulating coating layer 12. Moreover, the insulating coating layer 14 is also formed continuously around onto a portion of the upper surface of the piezoelectric layer 16. In concrete terms, the insulating coating layer 14 is formed in a region along the long side in the positive (+) Y direction of the piezoelectric layers 16 and 20 (i.e. a side that extends along the X direction) (that is, over the portion shown by the reference symbol 12b). Moreover, a difference in level (i.e. a step) is defined between the insulating coating layer 14, and the surface electrodes 22 and 24 and the piezoelectric layer 16 (refer to FIG. 3). Furthermore, it is desirable for the height of this step to be 50 nm or less, and to be greater than 0 μm; and it is more desirable for this height to be 5 μm or less and to be greater than 0 μm.

Incidentally, as will be clear from the above explanation, the sum of the widths of the insulating coating layers 12 and 14 that are formed upon the upper surface of the piezoelectric layer 16 becomes 2×W2, and this value is smaller than a half of the width W1 of the piezoelectric layer 16 (i.e. its width in the Y direction). Moreover, it is not necessary for the widths of the insulating coating layers 12 and 14 formed upon the upper surface of the piezoelectric layer 16 to be the same.

With the piezoelectric element 10 described above, when a voltage is applied between the surface electrode 22 and the surface electrode 24, an electric field is applied in the thickness direction of the piezoelectric layers 16, 18, and 20 (i.e. in the Z direction). When this is done, the piezoelectric layers 16, 18, and 20 expand in their thickness direction and also contract in their planar directions. While as described above this piezoelectric element 10 is used as an actuator that employs deformation in a planar direction (i.e., more exactly, deformation (displacement) in the X direction, it would also be possible to utilize the deformation in the Z direction.

Thus, with the piezoelectric element 10 described above, the internal electrode layers 26 and 28 that are exposed at the side surfaces of the piezoelectric element 10 are covered by the insulating coating layers 12 and 14. Due to this, it is possible to prevent the ingress of moisture into the neighborhood of the internal electrode layers 26 and 28, and it is possible to prevent migration taking place in the piezoelectric element 10. Due to this, it is possible to enhance the reliability of the piezoelectric element 10. Moreover, since it is possible effectively to prevent fouling during use, accordingly it is also possible to prevent deterioration of the insulation due to contamination.

Furthermore, as shown in FIGS. 4 and 5, while the insulating coating layers 12 and 14 of width W2 are formed upon the upper surface of the piezoelectric element 10, no insulating coating layers are formed upon the lower surface of the piezoelectric element 10. Due to this, it is possible simply and easily to distinguish whether the piezoelectric element 10 is presenting its upper surface or its lower surface, according to the presence or the absence of the insulating coating layers 12 and 14. In this way it is possible to prevent the operator from mounting the piezoelectric element 10 to a mounting surface while mistakenly interchanging its upper surface and its lower surface, which would be undesirable. Moreover, in the case that au insulating coating layer is also formed upon the lower surface of the piezoelectric element 10, then it is possible simply and easily to identify the upper surface and the lower surface of the piezoelectric element 10 by making the shapes (for example, the widths or the like) of the insulating layer that is formed upon the upper surface of the piezoelectric element 10 and of the insulating layer that is formed upon the lower surface of the piezoelectric element 10 to be different.

Yet further, with this piezoelectric element 10, a difference in level is formed between the insulating coating layers 12 and 14 and the surface electrodes 22 and 24. Due to this, even if the piezoelectric element 10 comes into contact with a mounting surface at its side where the step is formed, still direct contacting of the surface electrodes 22 and 24 against the mounting surface is prevented. This means that it is possible to suppress fouling of the surface electrodes 22 and 24.

Even further, with this piezoelectric element 10, the insulating coating layers 12 and 14 are formed entirely over both side surfaces of the piezoelectric element 10 (in the X-Z plane), and over only the regions upon the upper surface and/or the lower surface along the long sides that extend in the X direction. Moreover, the sum (2×W2) or (2×W3) of the widths of the insulating coating layers 12 and 14 that are formed upon the upper surface and/or upon the lower surface of the piezoelectric element 10 [i.e. the sum of their widths in the Y direction) is less than a half of the width W1 of the piezoelectric element 10 (i.e. its width in the Y direction). Because of this, while enhancing the strength of the piezoelectric element 10, it is also possible to prevent hampering of the displacement (i.e. of the deformation) of the piezoelectric element 10 in the X direction.

Next, the method for manufacturing this piezoelectric element 10 will be explained. It should be understood that publicly known prior art methods or similar may be employed for processes apart from the formation of the insulating coating layers and the formation of the electrodes on the side surfaces of the piezoelectric element. Because of this, the processes for formation of the insulating coating layers 12 and 14 upon the piezoelectric element 10 will be particularly explained in detail, while the other processes will only be explained in an outline manner.

Figure 10:
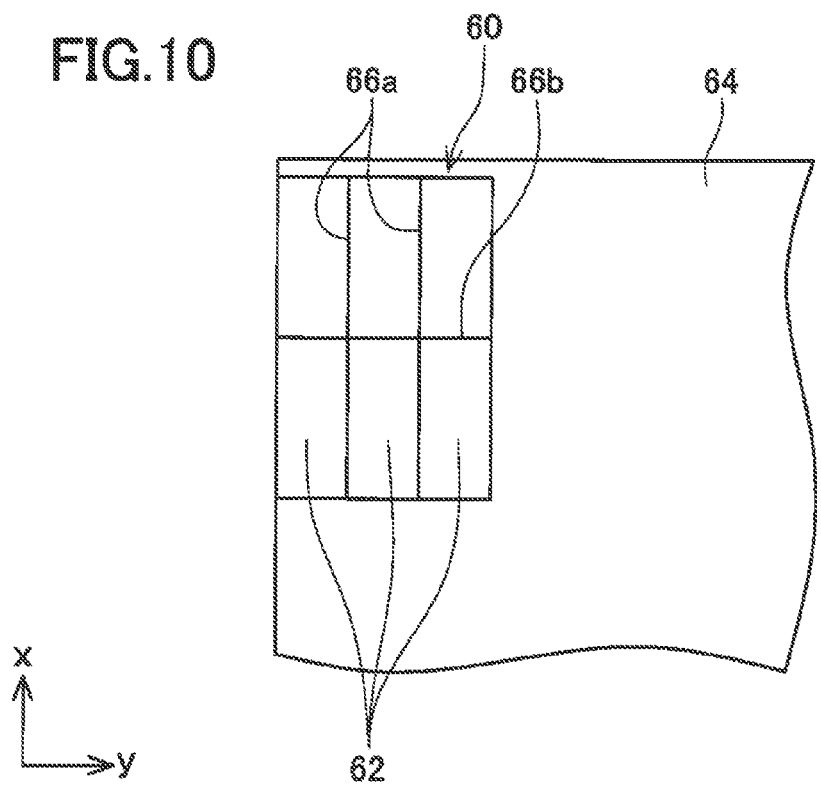
FIG. 10 is a first figure for explanation of a method for manufacturing the piezoelectric element 10.

First a laminated sheet 60 is prepared, in which three piezoelectric element sheets (in other words, sheets that will become the piezoelectric layers 16, 18, and 20) and two electrically conductive layers (in other words, electrically conductive layers that will become the internal electrode layers 26 and 28) disposed between adjacent ones of those piezoelectric element sheets are laminated together (refer to FIG. 10). This laminated sheet 60 may be manufactured according to a publicly known prior art method. For example, the piezoelectric sheets may be manufactured by green sheets (typically, green sheets made from a PZT series ceramic (Pb(Zr,Ti)O3) or the like as principal raw material) being shaped by a die cutting process, and by these piezoelectric sheets that have been shaped by the die cutting process, electrically conductive material layers, and adhesive layers being alternatingly laminated together. Next, the piezoelectric element sheet, the electrically conductive material layers, and the adhesive layers that have thus been laminated together are pressurized with a pressing machine, and thereby the laminated sheet 60 is manufactured. A plurality of laminated masses 62 (in other words, a plurality of portions that will become piezoelectric elements 10) is included in this laminated sheet 60 that has thus been manufactured. As shown in FIG. 10, the laminated sheet 60 that has thus been manufactured is adhered upon an adhesive sheet 64. Moreover, the plurality of laminated masses 62 that will become piezoelectric elements 10 is arranged upon the laminated sheet 60 so as to be contiguous both along the X direction and along the Y direction.

Next, the plurality of laminated masses 62 is separated out from the laminated sheet 60 by cutting the laminated sheet 60 along lines 66a extending along the X direction of the laminated masses 62 and along a line 66b extending along their Y direction. This cutting of the laminated sheet 60 may be performed with a dicing blade. Moreover it should be understood that, during this cutting of the laminated sheet with the dicing blade, gaps having only the width of the dicing blade are formed between adjacent ones of the laminated masses 62. In the state in which the laminated sheet 60 is cut up and is subdivided into the plurality of laminated masses 62, sufficient gaps are not formed between adjacent ones of the laminated masses 62. Thus, it would not be possible to apply the electrode layers (in other words, the layers that are to become the surface electrodes 22 and 24) and the insulating coating layers to the side surfaces of the laminated masses 62. Accordingly, it becomes necessary to leave adequate spaces at the side surfaces of the laminated masses 62.

Figure 11:
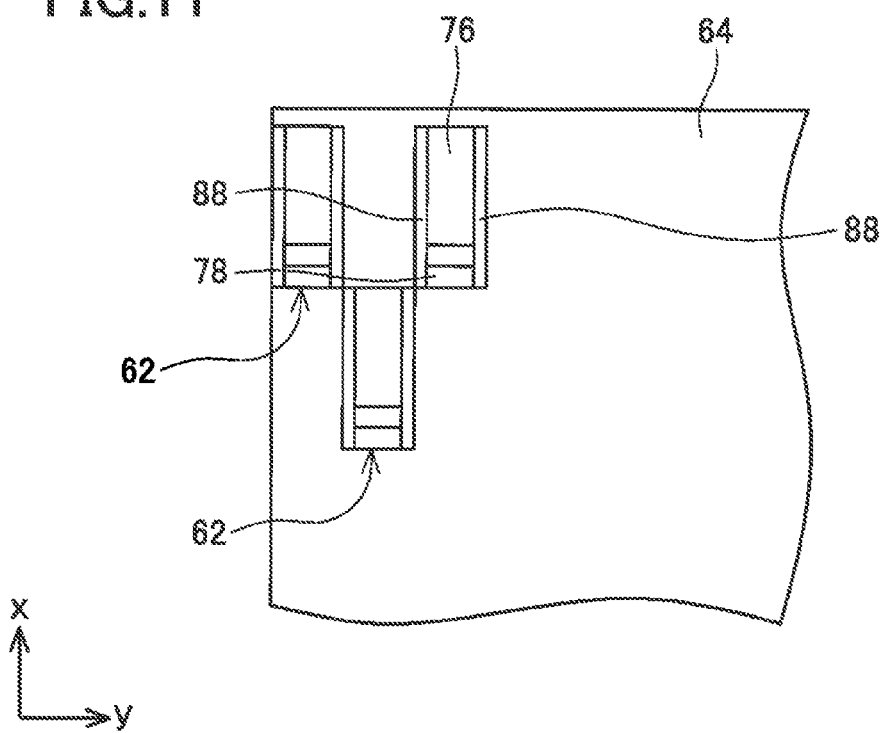
FIG. 11 is a second figure for explanation of this method for manufacturing the piezoelectric element 10.
Figure 12:
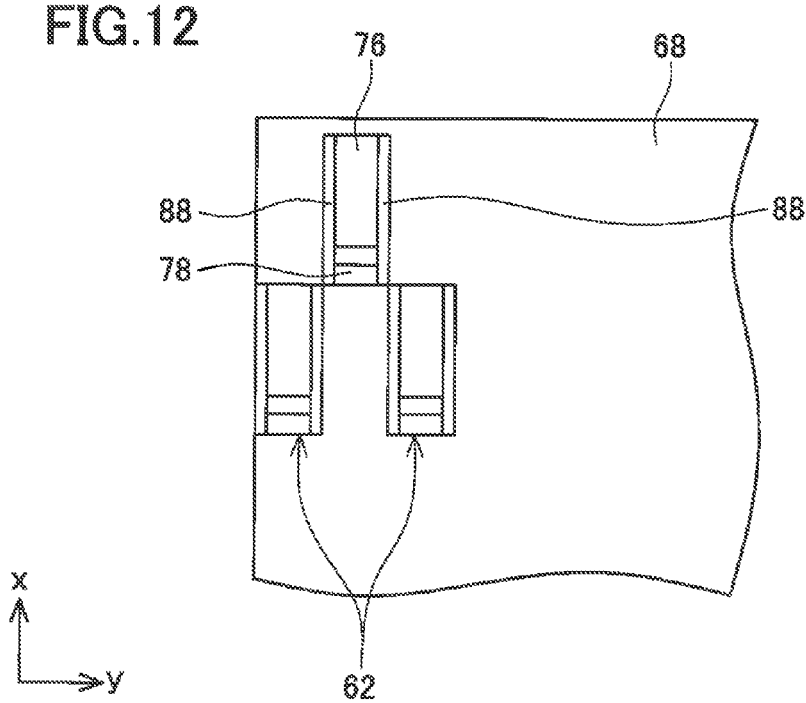
FIG. 12 is a third figure for explanation of this method for manufacturing the piezoelectric element 10.

Thus, as shown in FIG. 11, some of the laminated masses 62 are removed from the adhesive sheet 64, so that the remaining plurality of laminated masses 62 is arranged in a checker pattern upon the adhesive sheet 64. Due to this, adequate spaces are defined at the side surfaces of the laminated masses 62 that extend along the X direction and at their side surfaces that extend along their Y direction. Now, as shown in FIG. 12, it is possible to arrange the laminated masses 62 that have been removed from this adhesive sheet 64 in a checker pattern upon another adhesive sheet 68. By doing this, it is also possible to arrange for sufficient space to be defined at the side surfaces of the laminated masses 62 that have been arranged upon the adhesive sheet 68 as well.

When the spaces at the side surfaces of the laminated masses 62 are defined, first, electrode layers 76 and 78 that will become the surface electrodes 22 and 24 are formed upon the upper surfaces of the laminated masses 62 and upon their side surfaces that extend along the X direction (i.e. in the Y-Z plane). The formation of these electrode layers 76 and 78 may be performed by the same method as that for making an insulating coating layer 88 that will be described hereinafter. In concrete terms, instead of an insulating material in paste form that is used as an insulating coating material in the method for making the insulating coating layer 88 that will be described hereinafter, it is possible to make the electrode layers 76 and 78 by compounding the metal for manufacturing them into the form of a paste and by allowing this metal in paste form to pour down from the upper surfaces of the laminated masses 62, thus printing this material upon portions of the upper surfaces and the side surfaces of the laminated masses 62. The portions that will become the surface electrodes 22 and 24 are produced in this manner.

Figure 13:
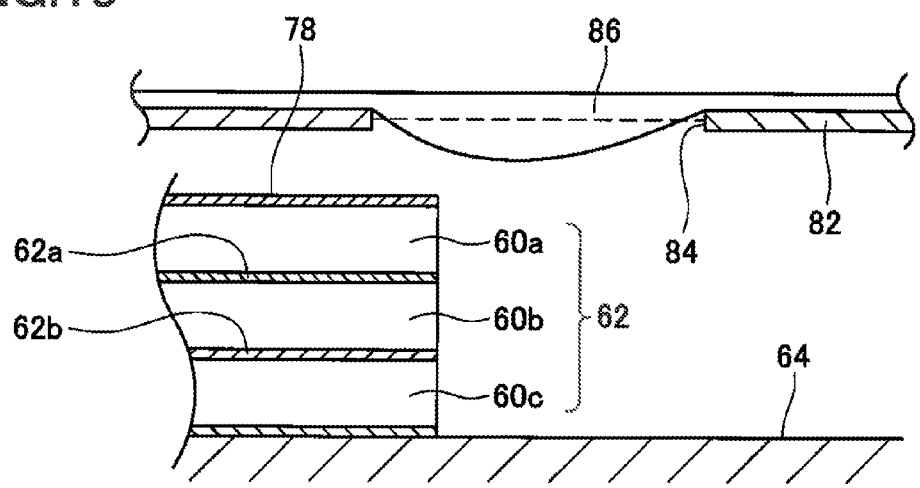
FIG. 13 is a figure for explanation of a method for manufacturing an insulating coating layer over the laminated piezoelectric element body.
Figure 14:
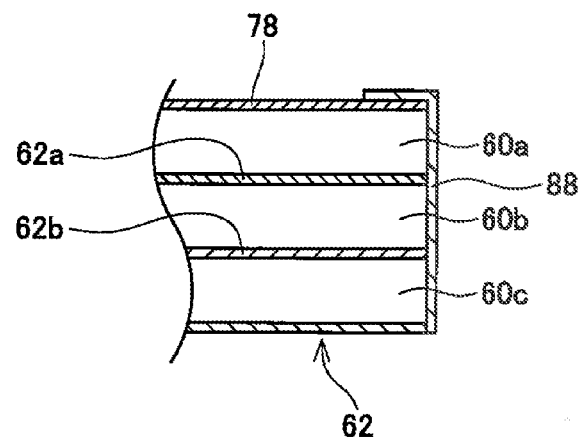
FIG. 14 is a partial sectional view showing the state of the laminated mass after the process shown in FIG. 13 has been performed.

Next, the insulating coating layer 88 is formed upon the upper surface and the side surfaces that extend in the Y direction (i.e. in the X-Z plane) of the laminated masses 62. The method for forming this insulating coating layer 88 will now be explained with reference to FIG. 13. As shown in FIG. 13, first, a screen plate 82 is placed into position over and with respect to the laminated masses 62. Apertures 84 (only one of which is shown in the figure) are formed in the screen plate 82, and an insulating material in paste form that is to become the material for the insulating coating layers 12 and 14 (for example, a PZT series ceramic (Pb(Zr,Ti)O3 or the like)) is allowed to drop down through this aperture 84. In the state in which the screen plate 82 is positionally fixed with respect to the laminated mass 62, the aperture 84 is superimposed over a portion of the upper surface of the laminated mass 62, and also is positioned so as to extend past the end surface of the laminated mass 62. In other words, when the screen plate 82 and the laminated mass 62 are looked at in planar view, the aperture 84 appears to open over and extend outward from the long side of the laminated mass 62. Next, insulating material 86 in paste form is supplied over the screen plate 82, and a squeegee (not shown in the figure) is pushed over the screen plate 82. By being pushed by the squeegee, the insulating material 86 in paste form is driven downward and falls through the aperture 84 in the screen plate 82. Since, as described above, the aperture 84 projects over from the side surface of the laminated mass 62 (i.e. over the X-Z plane of the piezoelectric element 10), accordingly the insulating material 86 in paste form that has fallen down through the aperture 84 in the screen plate 82 is printed upon a portion of the upper surface of the laminated mass 62 and upon its side surface (i.e. upon the X-Z plane of the piezoelectric element 10). Due to this, the situation becomes as shown in FIG. 14, and the insulating coating layer 88 (which will become portions of the insulating coating layers 12 and 14) is formed upon a portion of the upper surface of the laminated mass 62 and upon its side surface. In this manner, the formation of the electrode layers 76 and 78, and the formation of the insulating coating layers 88 are performed upon the laminated masses 62 that have been adhered to the adhesive sheets 64 and 68 (refer to FIGS. 11 and 12). Finally, the laminated masses 62 upon which the insulating coating layers 88 have been formed are fired, and thereby the piezoelectric elements 10 are manufactured.

Figure 15:
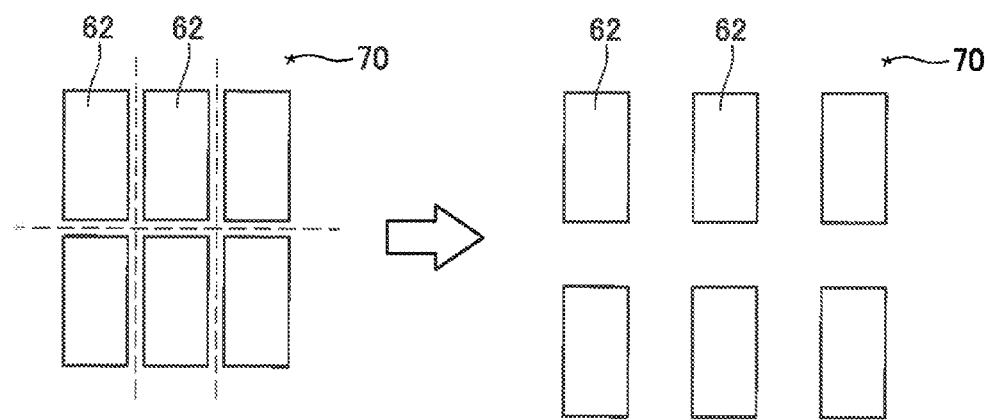
FIG. 15 is a figure for explanation of a method of manufacture according to a variant embodiment.

Now, when manufacturing the piezoelectric element 10, it would also be possible to adhere the laminated sheet 60 (in other words, the laminated sheet from which the plurality of laminated masses has been formed) over an adhesive sheet 70 that is elastic. And, as shown in FIG. 15, the laminated sheet 60 would be cut along dicing lines, and thereby the plurality of laminated masses 62 would be subdivided (this state is shown at the left side of FIG. 15). In this state, sufficient gaps are not defined between adjacent ones of the laminated masses 62, so that no spaces for formation of the electrode layers or the insulating coating layers are left at the side surfaces of the laminated masses 62. Due to this, the gaps between the laminated masses 62 are expanded by pulling out the elastic adhesive sheet 70 (this state is shown at the right side of FIG. 15). This ensures sufficient spaces between adjacent ones of the laminated masses 62. Since simply the adhesive sheet 70 expands, accordingly there is no requirement to detach some of the laminated masses 62 in order to ensure provision of spaces between the remainder thereof, or to rearrange some of the laminated masses 62 upon some other adhesive sheet after having detached them.

Or, as shown in FIG. 16, it would also be possible to manufacture a laminated sheet so that a plurality of laminated plate groups 90 (in other words, plate groups in each of which a plurality of laminated masses 62 are arranged continuously along the width direction, i.e. along the Y direction) is formed upon the laminated sheet. At this time, the plurality of laminated plate groups 90 is formed with gaps between them in the X direction of the laminated sheet. And this laminated sheet is adhered to an adhesive sheet 64, and the unnecessary portions are removed from the laminated sheet (this state is shown in FIG. 16). In the state shown in FIG. 16, since the laminated plate groups 90 are separated by gaps in the X direction, accordingly the side surfaces of the laminated masses 62 (i.e. the Y-Z planes of the piezoelectric elements 10) are exposed, and sufficient spaces for formation of the electrode layers are ensured extending along the Y directions of the laminated masses 62. Next, the electrode layers are formed upon the upper surfaces and the side surfaces (i.e. the Y-Z planes) of the laminated masses 62 (this state is shown in FIG. 17). And next the laminated plate groups 90 are separated out into the laminated masses 62, these laminated masses 62 are arranged with gaps left between them in the Y direction (for example, by being adhered), and insulating coating layers are formed upon the laminated masses 62. It is also possible to manufacture the piezoelectric elements 10 by this type of method as well.

As has been explained above, with the method of manufacturing the piezoelectric element 10 according to this embodiment, the insulating material 86 in paste form is printed simultaneously upon a portion of the upper surface of the laminated mass 62 and upon its side surfaces by making it drop down onto the protruding portion of the upper surface of the laminated mass 62 and from the upper surface of the laminated mass 62. Thus, since the insulating coating layer is formed simultaneously upon a plurality of the surfaces of the laminated mass 62 with a single episode of printing processing, accordingly it is possible to manufacture the piezoelectric elements 10 in an efficient manner with a single processing episode. Moreover, since the printing processing is performed using the screen plate 82, accordingly it is possible to print the insulating coating layers with good accuracy in the desired positions upon the laminated masses 62.

The correspondence relationship between the structures of this embodiment and the terms employed in the Claims will now be described. The insulating coating layers 12 and 14 are examples of the "coating layer"; the portions 22b and 24b of the surface electrodes 22 and 24 are examples of the "upper surface electrode", and the portions 22c and 24c of the surface electrodes 22 and 24 are examples of the "lower surface electrode".

Figure 6:
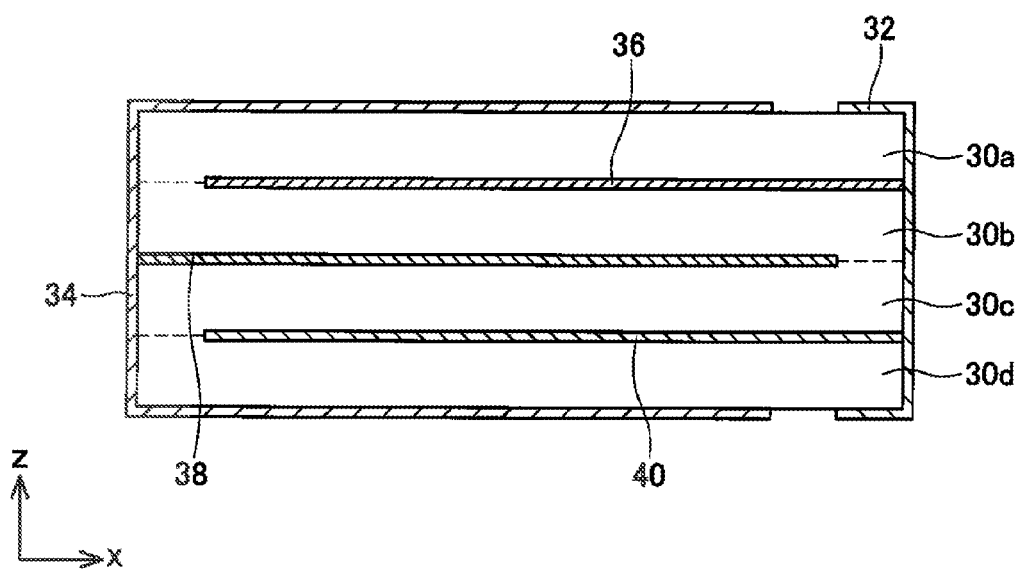
FIG. 6 is a sectional view of a piezoelectric element according to a variant embodiment (corresponding to the sectional view of FIG. 1 along the line II-II)
Figure 7:
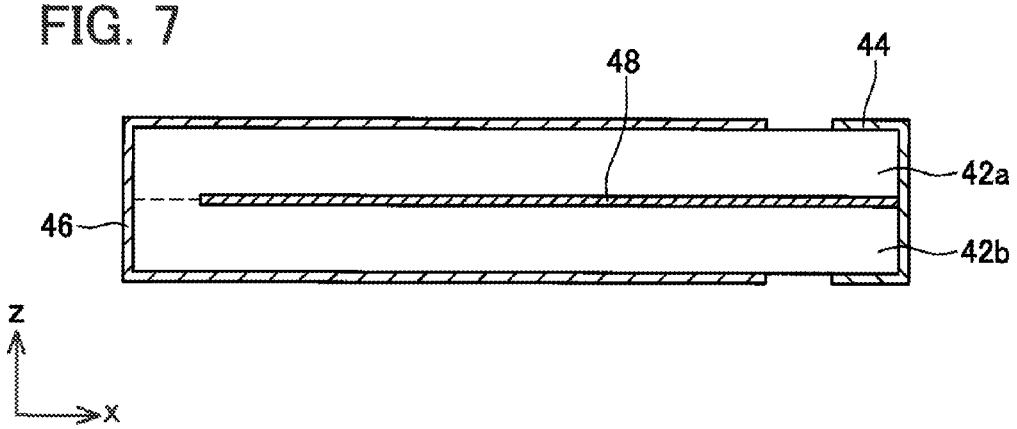
FIG. 7 is a sectional view of a piezoelectric element according to another variant embodiment (corresponding to the sectional view of FIG. 1 along the line II-II)

Now, while three piezoelectric layers 16, 18, and 20 were provided in the piezoelectric element 10 according to the embodiment described above, it would be possible to adjust the number of piezoelectric layers appropriately according to the mechanical characteristics desired for the piezoelectric element 10 to be obtained. For example, as shown in FIG. 6, it would be possible to provide a structure that incorporates four piezoelectric layers 30a through 30d. In this case as well, internal electrode layers 36, 38, and 40 are provided between adjacent ones of the piezoelectric layers 30a through 30d, and these internal electrode layers 36, 38, and 40 are connected to one or the other of surface electrodes 32 and 34. By doing this, it is possible to apply a voltage in the thickness direction (i.e. in the Z direction) to each of the piezoelectric layers 30a through 30d. Or, as shown in FIG. 7, it would be possible to provide a structure with only two piezoelectric layers 42a and 42b, and to provide a single internal electrode layer 48 between these two piezoelectric layers 42a and 42b. In this case, the internal electrode layer 48 would be connected to one of the surface electrodes 44.

Figure 8:
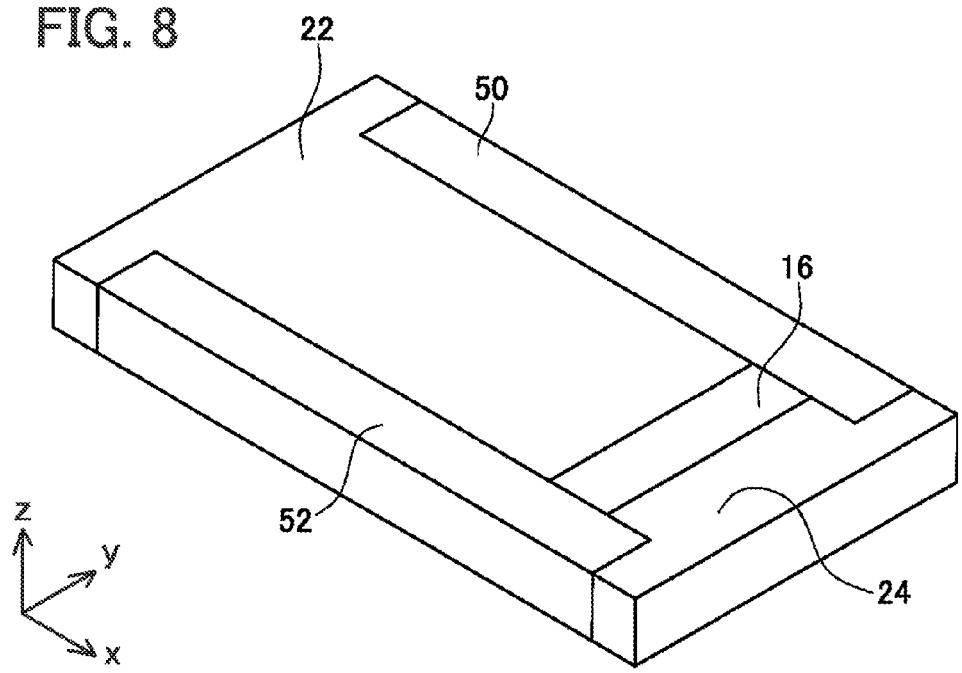
FIG. 8 is a perspective view of a piezoelectric element according to yet another variant embodiment.

Moreover while, with the piezoelectric element 10 according to the embodiment described above, the insulating coating layers 12 and 14 were formed over the entirety of both of the side surface of the piezoelectric element 10 (in the X-Z plane), it would also be possible, as for example in the case of the piezoelectric element shown in FIG. 8, to arrange to firm insulating coating layers 50 and 52 on only portions of the two side surfaces of the piezoelectric element 10 (in the X-Z plane). Moreover, it is desirable for these insulating coating layers 50 and 52 to be formed so as to cover the effective portions of the internal electrode layers (i.e. those portions thereof that generate electric fields for causing deformation of the piezoelectric layers). Even if only the effective portions of the internal electrode layers are covered, it is still possible to suppress migration in an adequate and appropriate manner.

Figure 18:
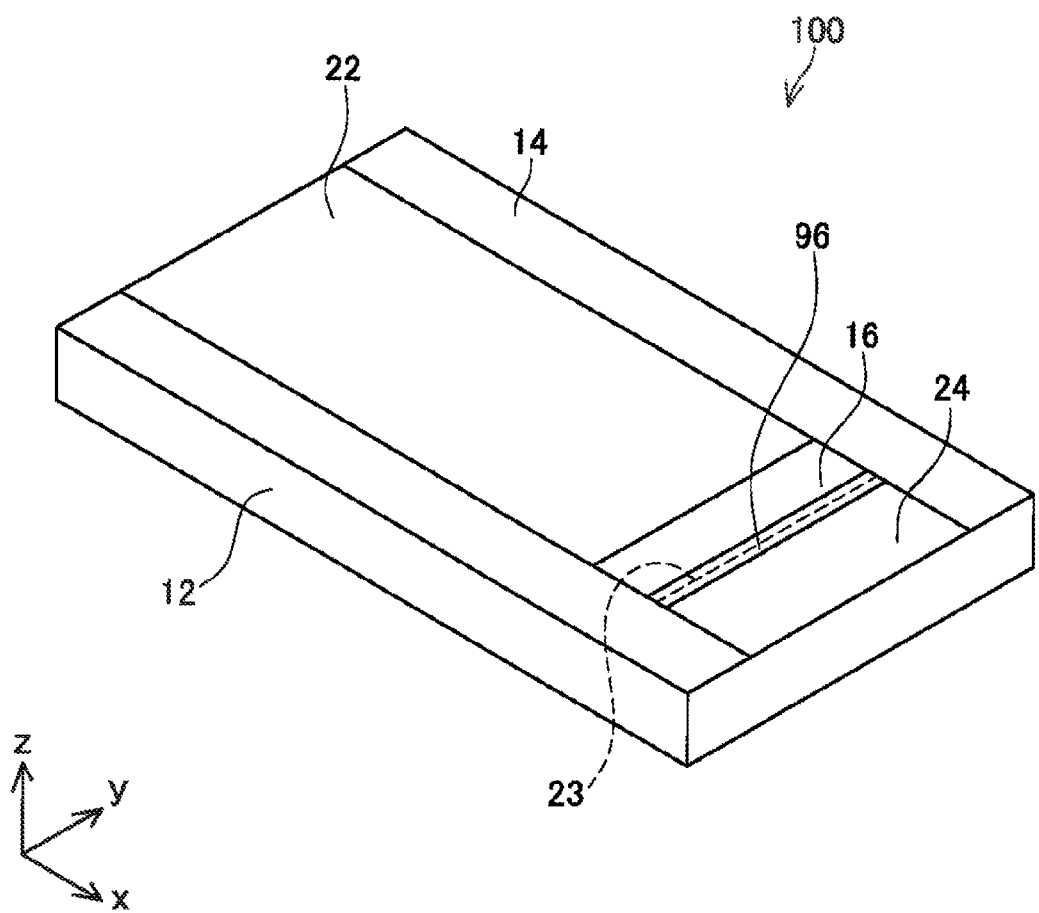
FIG. 18 is a perspective view of a piezoelectric element 100 according to another variant embodiment.
Figure 19:
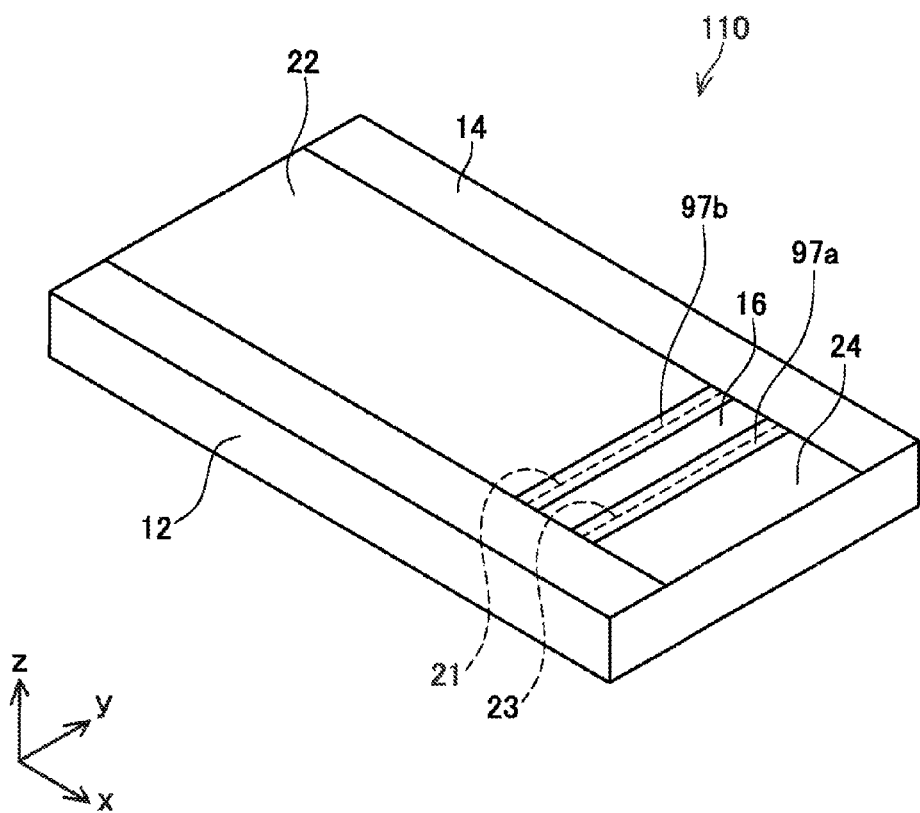
FIG. 19 is a perspective view of a piezoelectric element 110 according to yet another variant embodiment.
Figure 20:
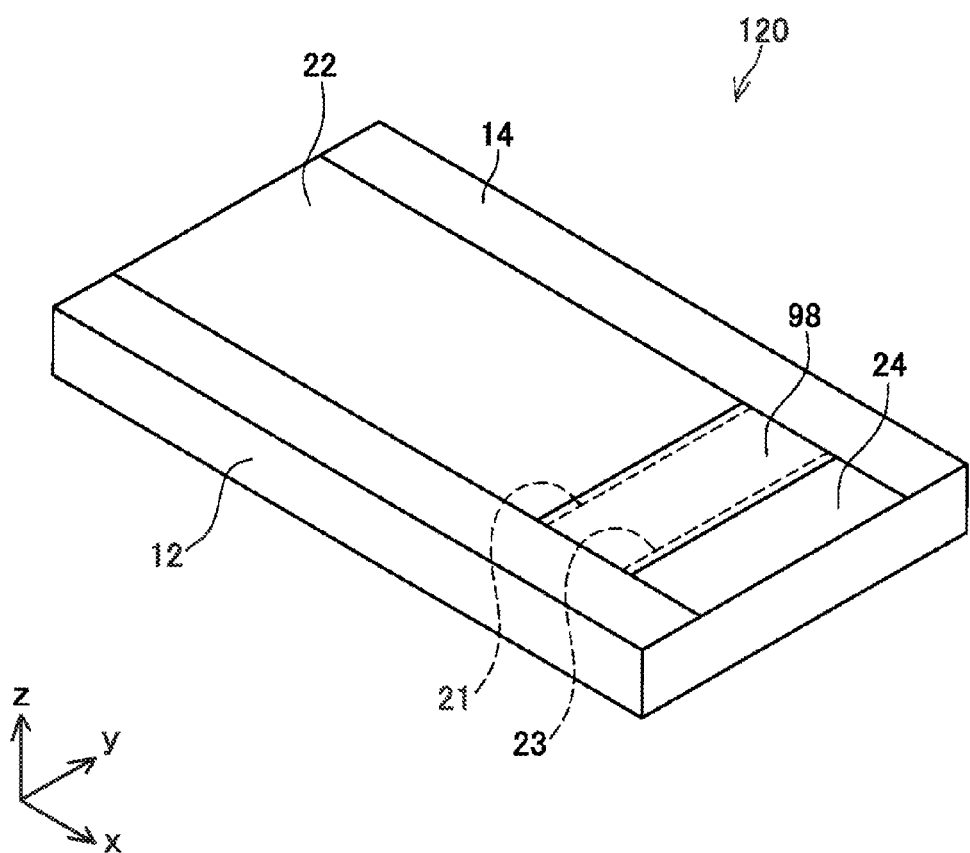
FIG. 20 is a perspective view of a piezoelectric element 120 according to still another variant embodiment.
Figure 21:
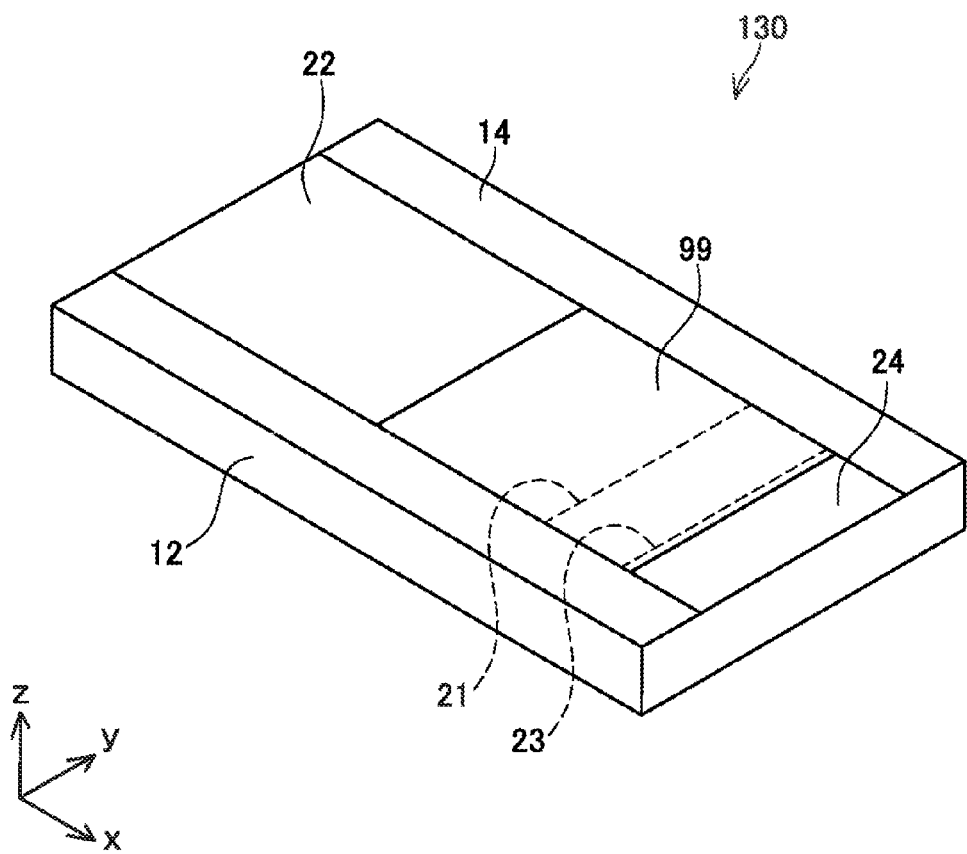
FIG. 21 is a perspective view of a piezoelectric element 130 according to even another variant embodiment.

Furthermore it would also be possible, as shown in FIG. 18, to arrange to cover the boundary portion between the surface electrode 24 and the piezoelectric layer 16 (i.e. the end portion 23 of the surface electrode 24) with an insulating coating layer 96. According to this type of structure, it is possible to suppress the entry of moisture or the like between the end surface of the surface electrode 24 and the piezoelectric layer 16, so that it is possible to enhance the reliability of this piezoelectric element 100. Moreover it would also be acceptable, as shown in FIG. 19, to arrange to cover the boundary portion between the surface electrode 22 and the piezoelectric layer 16 (i.e. the end portion 21 of the surface electrode 22) with an insulating cover layer 97b, and also to cover the boundary portion between the surface electrode 24 and the piezoelectric layer 16 (i.e. the end portion 23 of the surface electrode 24) with an insulating cover layer 97a. According to this type of structure, it is possible even further to suppress the entry of moisture, so that it is possible yet further to enhance the reliability of this piezoelectric element 110. Still further it would also be possible, as shown in FIG. 20, to arrange to cover all of the piezoelectric layer 16 that is exposed between the surface electrode 22 and the surface electrode 24 with an insulating coating layer 98. In this case, the insulating coating layer 98 will also cover over the end portions 21 and 23 of the surface electrodes 22 and 24. Since, with this type of structure, the end portions 21 and 23 of the surface electrodes 22 and 24 are not exposed at all, accordingly it is possible yet further to enhance the reliability of this piezoelectric element 120. Furthermore, in order to increase the distance between the end portions of the surface electrodes that are exposed to the upper surface, provided that it does not greatly hamper the displacement of the piezoelectric element, it would be possible to form an insulating coating layer over any desired wider range. For example, as shown in FIG. 21, it would be possible to form an insulating coating layer 99 so as to cover over a wide range of the surface electrode 22. If this type of structure is provided, then the distance between the wiring for connecting to the surface electrode 24 and the wiring for connecting to the surface electrode 22 becomes longer, and it is possible to prevent them short circuiting together in an appropriate manner. It should be understood that if an insulating coating layer 96, 97, 98, or 99 is provided upon the surface of the piezoelectric element 100, 110, 120, or 130 as shown in FIGS. 18 through 21, then these may be formed by the same process as the insulating coating layers 12 and 14 that are formed upon the upper surface and the side surface of the piezoelectric element 100, 110, 120, or 130. In other words, it will be possible to prepare a screen plate further having an aperture that corresponds to the insulating coating layer 96, 97, 98, or 99, and to make the insulating material in paste form pass through the aperture in this screen plate. Moreover while, in the examples described above, cases were cited in which the insulating coating layer 96, 97, 98, or 99 was formed upon the upper surface of the piezoelectric element 100, 110, 120, or 130, it would be possible to form an insulating coating layer of this type upon the lower surface of the piezoelectric element, and it would also be possible to form such insulating coating layers upon both the upper surface and the lower surface of the piezoelectric element.

Moreover while, in the method of manufacture of the piezoelectric element 10 according to the embodiment described above, the portions that will became the insulating coating layers 12 and 14 are formed after having formed the portions upon the laminated mass that will become the surface electrodes 22 and 24, this is not to be considered imitative of the method. For example, it would also be possible to form the portions that will become the surface electrodes 22 and 24 after having formed the portions that will become the insulating coating layers 12 and 14 upon the laminated mass.

Figure 9:
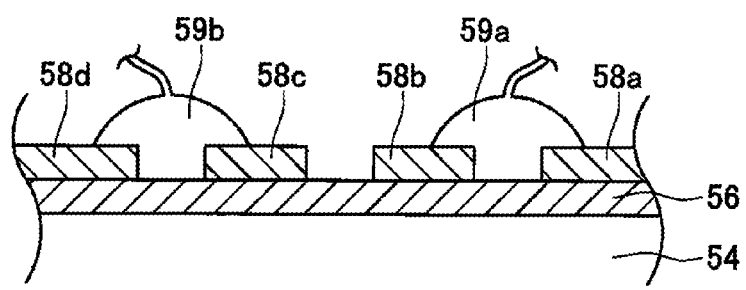
FIG. 9 is an enlarged view showing a structure for wiring connection that employs the insulating coating layer.

Incidentally, by connecting wiring to the electrodes by taking advantage of the insulating coating layer formed upon the surface of the piezoelectric element, it is possible to narrow down the gaps between different portions of the wiring while still preventing short circuiting between them. For example, as shown in FIG. 9, an electrode 56 may be formed upon the piezoelectric layer 54, and insulating coating layers 58a through 58d may be formed upon this electrode 56 with gaps being left between them, so that apertures are defined between adjacent ones of the insulating coating layers 58a through 58d. And wiring 59a may be connected to the electrode 56 by employing the aperture between the insulating coating layers 58a and 58b, while wiring 59b is connected to the electrode 56 by employing the aperture between the insulating coating layers 58c and 58d. Since a gap is provided between the insulating coating layer 58b and the insulating coating layer 58c, accordingly it is possible to narrow down the gap between the wiring 59a and the wiring 59b while still preventing short circuiting between the wiring 59a and the wiring 59b.

The present embodiments are described above in detail, but these examples are merely illustrative and place no limitation on the scope of the patent claims. The technology described in the patent claims also encompasses various changes and modifications to the specific examples described above. Further, it is to be understood that the technical elements described in the present specification and the drawings exhibit technical usefulness solely or in various combinations thereof and shall not be limited to the combinations described in the claims at the time of filing. Furthermore, the techniques illustrated in the present specification and the drawings are to achieve a plurality of objectives at the same time, whereby technical usefulness is exhibited by attaining any one of such objectives.

The invention claimed is:

1. A piezoelectric element comprising:
    a plurality of piezoelectric layers laminated on each other; and
    an internal electrode layer disposed between adjacent piezoelectric layers, wherein
    a coating layer is disposed on a side surface of the piezoelectric element and at least one of upper and lower surfaces of the piezoelectric element,
    the coating layer contiguously extends from the side surface of the piezoelectric element to the at least one of the upper and lower surfaces of the piezoelectric element,
    the coating layer covers an effective portion of the internal electrode layer, the effective portion being exposed at the side surface of the piezoelectric element,
    the coating layer covers a predetermined peripheral part of the at least one of the upper and lower surfaces of the piezoelectric element, and
    the at least one of the upper and lower surfaces of the piezoelectric element has a step formed at an edge of the predetermined peripheral part by the coating layer,
    wherein in a planar view, the piezoelectric element has a rectangular shape having a pair of first sides extending in a first direction and a pair of second sides extending in a second direction perpendicular to the first direction,
    the piezoelectric element further comprising:
    a first surface electrode disposed on the at least one of the upper and lower surfaces of the piezoelectric element, the first surface electrode extending along one of the pair of second sides of the piezoelectric element;
    a second surface electrode disposed on the at least one of the upper and lower surfaces of the piezoelectric element, the second surface electrode being disposed away from the first surface electrode and extending along the other of the pair of the second sides of the piezoelectric element;
    the coating layer is disposed on the at least one of the upper and lower surfaces of the piezoelectric element and extends along the pair of the first sides, and
    a second coating layer covering at least one of a second surface electrode-side edge of the first surface electrode and a first surface electrode-side edge of the second surface electrode.

2. The piezoelectric element as in claim 1, wherein
    the coating layer is disposed on both of the upper and lower surfaces of the piezoelectric element, and
    a shape of a first part of the coating layer is different from a shape of a second part of the coating layer, the first part being disposed on the at least one of the upper and lower surfaces of the piezoelectric element, and the second part being disposed on the other of the at least ibe of the upper and lower surfaces of the piezoelectric element.

3. The piezoelectric element as in claim 2, further comprising the first surface electrode disposed on the other of the at least one of the upper and lower surfaces of the plurality of laminated piezoelectric layers, and the second surface electrode disposed on the other of the at least one of the upper and lower surfaces of the plurality of laminated piezoelectric layers,
    wherein the coating layer is disposed on the other of the at least one of the upper and lower surfaces of the first and second surface electrodes, and a step is formed at a boundary between the coating layer and the first and second surface electrodes.

4. The piezoelectric element as in claim 3, wherein
    in the planar view, the piezoelectric element has a rectangular shape having long sides as the pair of the first sides and short sides as the pair of the second sides,
    deformation of the piezoelectric element in a direction parallel to the long sides of the pair of the first sides is used as an actuator, and
    the coating layer disposed on the at least one of the upper and lower surfaces of the piezoelectric element is disposed along the long sides of the pair of the first sides of the piezoelectric element.

5. The piezoelectric element as in claim 4, wherein
    the coating layer is disposed on both side surfaces of the piezoelectric element,
    the coating layer is disposed on the at least one of the upper and lower surfaces of the piezoelectric element and extends along the long sides of the pair of the first sides of the piezoelectric element, in the at least one of the upper and lower surfaces of the piezoelectric element, a sum of a first width of the coating layer extending along one of the long sides of the pair of the first sides of the piezoelectric element and a second width of the coating layer extending along the other of the long sides of the pair of the first sides of the piezoelectric element is shorter than half of a short side length of the piezoelectric element, and the first and second widths are widths in a direction parallel to the short sides of the pair of second sides of the piezoelectric element.

6. The piezoelectric element as in claim 1, further comprising the first surface electrode disposed on the other of the at least one of the upper and lower surfaces of the plurality of laminated piezoelectric layers, and the second surface electrode disposed on the other of the at least one of the upper and lower surfaces of the plurality of laminated piezoelectric layers, wherein the coating layer is disposed on the other of the at least one of the upper and lower surfaces of the first and second surface electrodes, and a step is formed at a boundary between the coating layer and the first and second surface electrodes.

7. The piezoelectric element as in claim 6, wherein in the planar view, the piezoelectric element has a rectangular shape having long sides as the pair of the first sides and short sides as the pair of the second sides, deformation of the piezoelectric element in a direction parallel to the long sides of the pair of first sides is used as an actuator, and the coating layer disposed on the at least one of the upper and lower surfaces of the piezoelectric element is disposed along the long sides of the pair of the first sides of the piezoelectric element.

8. The piezoelectric element as in claim 1, wherein in the planar view, the piezoelectric element has a rectangular shape having long sides as the pair of the first sides and short sides as the pair of the second sides, deformation of the piezoelectric element in a direction parallel to the long sides of the pair of the first sides is used as an actuator, and the coating layer disposed on the at least one of the upper and lower surfaces of the piezoelectric element is disposed along the long sides of the pair of the first sides of the piezoelectric element.

9. The piezoelectric element as in claim 2, wherein in the planar view, the piezoelectric element has a rectangular shape having long sides as the pair of the first sides and short sides as the pair of the second sides, deformation of the piezoelectric element in a direction parallel to the long sides of the pair of the first sides is used as an actuator, and the coating layer disposed on the at least one of the upper and lower surfaces of the piezoelectric element is disposed along the long sides of the pair of the first sides of the piezoelectric element.

10. The piezoelectric element as in claim 7, wherein the coating layer is disposed on both side surfaces of the piezoelectric element, the coating layer is disposed on the at least one of the upper and lower surfaces of the piezoelectric element and extends along the long sides of the pair of the first sides of the piezoelectric element, in the at least one of the upper and lower surfaces of the piezoelectric element, a sum of a first width of the coating layer extending along one of the long sides of the pair of the first of the piezoelectric element and a second width of the coating layer extending along the other of the long sides of the pair of the first sides of the piezoelectric element is shorter than half of a short side length of the piezoelectric element, and the first and second widths are widths in a direction parallel to the short sides of the pair of the second sides of the piezoelectric element.

11. The piezoelectric element as in claim 8, wherein the coating layer is disposed on both side surfaces of the piezoelectric element, the coating layer is disposed on the at least one of the upper and lower surfaces of the piezoelectric element and extends along the long sides of the pair of the first sides of the piezoelectric element, in the at least one of the upper and lower surfaces of the piezoelectric element, a sum of a first width of the coating layer extending along one of the long sides of the pair of the first sides of the piezoelectric element and a second width of the coating layer extending along the other of the long sides of the pair of the first sides of the piezoelectric element is shorter than half of a short side length of the piezoelectric element, and the first and second widths are widths in a direction parallel to the short sides of the pair of the second sides of the piezoelectric element.

12. The piezoelectric element as in claim 9, wherein the coating layer is disposed on both side surfaces of the piezoelectric element, the coating layer is disposed on the at least one of the upper and lower surfaces of the piezoelectric element and extends along the long sides of the pair of the first sides of the piezoelectric element, in the at least one of the upper and lower surfaces of the piezoelectric element, a sum of a first width of the coating layer extending along one of the long sides of the pair of the first sides of the piezoelectric element and a second width of the coating layer extending along the other of the long sides of the pair of the first sides of the piezoelectric element is shorter than half of a short side length of the piezoelectric element, and the first and second widths are widths in a direction parallel to the short sides of the pair of the second sides of the piezoelectric element.

13. The piezoelectric element as in claim 1, wherein the first surface electrode and the second surface electrode are disposed on the upper surface of the piezoelectric element, the second surface electrode being disposed away from the first surface electrode.

14. The piezoelectric element as in claim 13, wherein the second coating layer covers the second surface electrode-side edge of the first surface electrode and the first surface electrode-side edge of the second surface electrode.

15. The piezoelectric element as in claim 14, wherein the second coating layer covers the upper surface of the piezoelectric element which is exposed between the first surface electrode and the second surface electrode.

16. The piezoelectric element as in claim 15, wherein the second coating layer covers an area of the first surface electrode exceeding the second surface electrode-side edge of the first surface electrode.

* * * * *